United States Patent
Hernandez et al.

(10) Patent No.: US 9,298,089 B1
(45) Date of Patent: Mar. 29, 2016

(54) COMPOSITION FOR RESIST PATTERNING AND METHOD OF MANUFACTURING OPTICAL STRUCTURES USING IMPRINT LITHOGRAPHY

(71) Applicants: Carlos Pina Hernandez, Berkeley, CA (US); Christophe Peroz, San Francisco, CA (US); Stefano Cabrini, Albany, CA (US)

(72) Inventors: Carlos Pina Hernandez, Berkeley, CA (US); Christophe Peroz, San Francisco, CA (US); Stefano Cabrini, Albany, CA (US)

(73) Assignee: Abeam Technologies, Inc., Castro Valley, CA (US)

( * ) Notice: Subject to any disclaimer, the term of this patent is extended or adjusted under 35 U.S.C. 154(b) by 0 days.

(21) Appl. No.: 14/340,539

(22) Filed: Jul. 24, 2014

(51) Int. Cl.
| | |
|---|---|
| *G03F 7/027* | (2006.01) |
| *G03F 7/028* | (2006.01) |
| *G03F 7/20* | (2006.01) |
| *C08L 25/00* | (2006.01) |

(52) U.S. Cl.
CPC ............... *G03F 7/0275* (2013.01); *C08L 25/00* (2013.01); *G03F 7/027* (2013.01); *G03F 7/028* (2013.01); *G03F 7/2002* (2013.01)

(58) Field of Classification Search
CPC ...... C08L 25/18; G02B 3/0087; G02B 1/041; G02B 1/04; G02B 6/443; C08F 212/34; C08F 2/00; C08F 2/48; G02C 2202/14; G02C 2202/12; G03F 7/0037; G03F 7/0275; G03F 7/027; G03F 7/2002
USPC .................. 430/322, 270.1; 359/642, 652
See application file for complete search history.

(56) References Cited

U.S. PATENT DOCUMENTS

| | | | |
|---|---|---|---|
| 2005/0046957 A1* | 3/2005 | Lai et al. | 359/652 |
| 2008/0068723 A1* | 3/2008 | Jethmalani et al. | 359/642 |

* cited by examiner

*Primary Examiner* — Caleen Sullivan

(57) ABSTRACT

Provided is a composition for resist patterning comprising a thiol; at least one -ene monomer; at least one polymerization initiator; and, optionally, a metal oxide used in an amount of 0.1 to 50 wt. % per weight of the composition; the thiol and -ene monomer are used in a stoichiometric ratio with a refractive index between 1.6 and 1.8. The composition is used in a patterning process wherein the composition is dispensed to the substrate, is covered with a mask, and is cured, e.g., by UV radiation, at room temperature with light having a wavelength in the range of 200 nm to 450 nm. The process may be carried out with thermal annealing.

20 Claims, 2 Drawing Sheets

COMPOSITION FOR RESIST PATTERNING AND METHOD OF MANUFACTURING OPTICAL STRUCTURES USING IMPRINT LITHOGRAPHY

FIELD OF THE INVENTION

The present invention relates to a composition for a nanoimprint process and to a method of nanoimprinting optical structures with the use of composition by patterning.

BACKGROUND OF THE INVENTION

Nanoimprint lithography (NIL) is a relatively new technology that finds use in the manufacture of planar micro- and nanodevices at low cost and with high productivity. Such effects result from the fact that in distinction from other known methods of generation and image transfer having nanodimensions, nanoimprint technology makes it possible to transfer a nanoimage as a whole and in one step instead of a multistage sequential transfer of image parts.

A similar task of one-step pattern image transfer is achieved by using modern optical steppers of high resolution. However, such technology is much more complicated and expensive than nanoimprinting.

Nanoimprinting consists of forming a pattern by means of a patterning lithography method, i.e., interference lithography, imprinting, or electron beam lithography (EBL) directly on the surface of the die or mold (template) and then reproducing the pattern by physical contact, e.g., by printing the pattern on a substrate, in particular on the resist layer of a substrate. This process may be repeated by using the same mold many times.

Depending on the nature of the imprinting materials, two main versions of NIL may be used, i.e., thermal NIL, which is based on use of the thermomechanical properties of resist films, and UV NIL, which is carried out with the use of a liquid resist material that is cured by ultraviolet light. Curing provides fixation of the image reproduced on the surface of the resist.

Furthermore, along with traditional nanolithography, NIL can also be used for forming functional surfaces or printable integrated devices by directly imprinting a functional resist material (also known in this field as ink).

One important application of NIL processes is the manufacturing of optical devices. For this purpose it is necessary to impart to the optical layers of such devices optical properties that can be controlled by chemical properties of the resist in which the pattern is formed. The main optical properties that should be controlled in the optical layers of the aforementioned devices are the refractive index and the level of optical losses.

Attempts have been made to control these properties. For example, a few works have reported the manufacturing of printed nanostructured surfaces and devices with a low refractive index ($n \approx 1.45$ to $1.55$) in optical layers. The most successful example was reported last year with the introduction of nanoimprinted structures in the display of the Amazon Kindle Paperwhite tablet for front illumination (light-guide technology). However, the applications of printable devices are still very limited because the currently available NIL inks have relatively low refractive indices ($n<1.62$). The inks used in the above studies were limited to $n<1.65$, and there were no reports on a roll-to-roll process.

Several approaches have been investigated over the last five years to develop imprintable materials with high refractive index ($n>1.65$).

The work of Carlos Pina-Hernandez, et al, "A route for fabricating printable photonic devices with sub-10 nm resolution" published in *Nanotechnology*, Vol. 24, No. 6, January 13, discloses a novel and robust route for high-throughput, high-performance nanophotonics-based direct imprint of high refractive index and low-visible-wavelength absorption materials. Sub-10 nm TiO2 nanostructures are fabricated by low-pressure UV imprinting of organic-inorganic resist materials. Postimprint thermal annealing allows optical property tuning over a wide range of values. For instance, a refractive index higher than 2.0 and an extinction coefficient close to zero can be achieved in the visible wavelength range. Furthermore, the imprint resist material permits fabrication of crack-free nanopatterned films over large areas and is compatible for fabricating printable photonic structures.

One strategy is based on the use of inorganically cross-linked sol-gel materials, which due to their high thermal, chemical, and mechanical stability, are well suited for forming photonic functional layers. Furthermore, the optical properties of these materials are easily tunable (G. Rizzo, et al, "Sol-gel glass from organic modified silicates for optics applications," *J. Sol Gel Sci. Techn.* 26, 1017 (2003); M. Li, et al, "Large area direct nanoimprinting of $SiO_2$—$TiO_2$ gel gratings for optical applications," J. *Vac. Sci. Technol.* B 21(2), 660 (2003); and M. Okinaka, et al, "Direct nanoimprint of inorganic-organic hybrid glass," *J. Vac. Sci. Technol.* B 24(3), 1402 (2006).

Previous studies have demonstrated the patterning of sol-gel materials by thermal nanoimprinting, but they were limited by time-consuming and complex procedures (high pressure, temperatures, and plasma treatment) (see, e.g., C. Marzolin, et al., "Fabrication of glass microstructures by micro-molding of sol-gel precursors," *Adv. Mater.* 10(8), 571 (1998); and S. H. Um, et al, "Direct imprinting of high resolution TiO2 nanostructures," *Nanotechnology* 21, 285303 (2010)].

It was recently demonstrated that hybrid organic-inorganic materials based on sol-gel chemistry offer a powerful alternative solution that overcomes these limitations. The obtained polymerized metal-organic materials demonstrated the fabrication of printable photonic devices into titania films with a refractive index up to $n=2$ for the first time (see C. Marzolin, et al, "Fabrication of Glass microstructures by micro-molding of sol-gel precursors," *Adv. Mater.* 10(8), 571 (1998); and S. H. Lim, et al, "Direct imprinting of high resolution TiO2 nanostructures," *Nanotechnology* 21, 285303, 2010)

It was shown in the work of Carlos Pina-Hernandez, et al, (see above) and in International Patent Publication PCT/US13/72109 that the process is suitable for high-resolution patterning with the replication of sub-10 nm structures. More interestingly, the process is suitable for fabricating printable photonic devices. The chip contains an on-chip demultiplexer, multimode ridge waveguides, and a light splitter. Each component is successfully measured. These results are state-of-the-art for imprinting high-refractive-index materials. However, the NIL ink used in the above work required a long postannealing step and the use of a high temperature; however, in view of the presence of a sol-gel composition, high temperatures are not suitable for nanoimprinting.

The second strategy consists of developing a resist material based on a polymer matrix doped with nanoparticles (most of the time TiO2). Based on a similar approach, previous works have reported the fabrication of transparent films with different polymer matrices (no thiol-ene) and a refractive index up to 1.8 (see H. I. Elim, et al, "A Novel Preparation of High-Refractive-Index and Highly Transparent Polymer Nanohybrid Composites," *J. Phys. Chem.* B, 2009, 113, 10143-8; P. Tao, et al, "Polymer 54" (2013) 1639-1646; and Arfat Pradana, Christian Kluge, and Martina Gerken, "Tailoring the refractive index of nanoimprint resist by blending with $TiO_2$ nanoparticles," *Optical Materials Express*, Vol. 4, Issue 2, pp. 329-337, 2014.)

Thus, the chemical composition of ink, its chemical properties, and its adaptability for treatment in the course of nanoprinting are important factors that affect the quality of the final product.

Also known in the art of imprinting is the use of a thiolene resist, which has the advantage of imprinting and cross-linking in the presence of $O_2$. The thiol-ene reaction (also alkene hydrothiolation) is an organic reaction between a thiol and an alkene. The reaction product is an alkenyl sulfide.

In this connection, reference can be made to the works of E. C. Hagberget, et al, "Effects of Modulus and Surface Chemistry of Thiol-Ene Photopolymers in Nanoimprinting," *Nano Letters*, Vol. 7, No. 2 (2007); and S. Khire, "Formation and Surface Modification of Nanopatterned Thiol-ene Substrates using Step and Flash Imprint," *Advanced Materials*, 3308-3313 (2008).

Chemically speaking, the aforementioned authors describe the following composition: thiol-pentaerythritol tetrakis-(2-mercaptopropionate) (PTMP); the ene component selected from (T1) 1,4-cyclohexanedimethanol divinyl ether (E1), (T2) 2-ethyl-2-(hydroxymethyl)-1,3-propanediol triacrylate (E2); (T3) 2,4,6-triallyloxy-1,3,5-triazine (E3) 1375; (T4) [50%] E1+[50%] bisphenol (E4) 460 E4-ethoxylated(2) bisphenol A dimethacrylate; (T5) [50%] E2+[50%] bisphenol (E4) 425; and (T6) [50%] E3+[50%] bisphenol (E4) 1800; and a photoinitiator, as an optional component, which was unidentified in the publication. All of these works involve the use of thiol-ene with a low refractive index (n<1.60).

However, the authors did not mention optical properties since their goal was only to develop an imprint resist with cross-linking in the presence of $O_2$.

It is known that thiol and vinyl monomers with a functionality of 2 or higher can be used to create cross-linked materials. The ability of thiol-ene chemistry to photocross-link in the presence of air makes this approach very attractive for the NIL process when compared to materials based on radical polymerization, which are inhibited by oxygen. However, there are only a few works in the literature that have reported the direct imprinting of thiol-ene polymers with a resolution down to 100 nm (see above).

Another advantage of the above-mentioned materials is that they do not require postannealing, and they allow reaching a refractive index up to 1.7 at 546-nm wavelength. The relatively low viscosity (<0.1 Pa·s) of a thiol-ene polymer makes it suitable for the roll-to-roll imprint process. For the reasons mentioned above and taking into account a wide variety of available thiols and vinyl monomers, these materials become very attractive for types of ink used in the roll-to-roll imprint process. Another advantage of thiol-enes is their strong chemical resistance to different types of solvents as well as low gas permeability and good adherence to glass and metal, which makes thiol-enes ideal candidates for use as a functional ink for nanoimprinting.

SUMMARY OF THE INVENTION

Provided is a composition for resist patterning comprising a thiol; at least one -ene monomer; at least one polymerization initiator; and, optionally, at least one metal oxide used in an amount ranging from 0.1 to 50 wt. % per weight of the composition; the thiol and the -ene monomer with a refractive index in the range of 1.6 to 1.8 and use in a stoichiometric ratio. The composition is used in a patterning process wherein the composition is dispensed to a substrate, is covered with a mask, and is cured by thermal or radiation energy, e.g., by UV radiation at room temperature with light having a wavelength ranging from 244 nm to 400 nm.

The authors have unexpectedly found that the use of a polymer matrix with a thiol having a low molecular weight but a high refractive index and multifunctional molecules of "ene" (E) monomers mixed with a polymerization initiator and optionally with inorganic nanoparticles ($TiO_2$, ZnO, etc) imparts to the patterned structures improved transparency (T>90%) and a high refractive index (n>1.65) unattainable with any known prior art composition without a postannealing step.

DETAILED DESCRIPTION OF THE INVENTION

Figure 1:
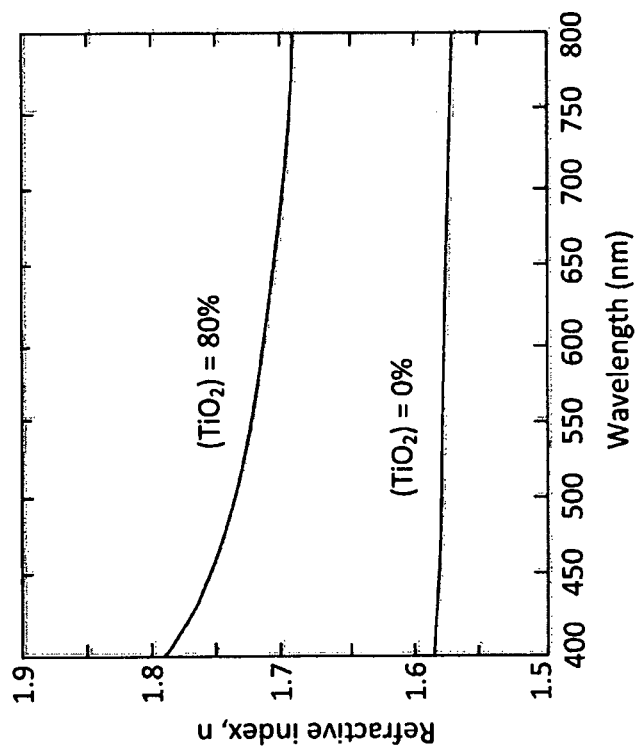
FIG. 1 shows the effect of the content of $TiO_2$ in the composition of the invention, where the refractive index (n) is plotted on the ordinate axis, and the wavelength (nm) is plotted on the abscissa axis.

An object of the invention is to provide a composition for a nanoimprint process and a method of nanoimprinting optical structures with use of the above-described composition. The composition and the method of the invention are based on the aforementioned second strategy of developing a resist material based on a high-refractive-index polymer matrix that may optionally be doped with an inorganic precursor (most of the time $TiO_2$).

The main objective of the invention is to provide optical transparency and coefficient of refraction of the composition for nanoimprint processes which are superior to similar characteristics of the prior-art materials used for the same purpose.

The composition of the invention for use in nanoimprint and in other patterning processes imparts to nanopatterned structures novel features that make them superior to similar prior-art structures. In fact, the material of the invention is a resist, which comprises a polymeric matrix that incorporates organic constituents, such as a thiol, an -ene monomer, a polymerization initiator, a stabilizer, and, optionally, a costabilizer, a solvent, and inorganic components such as $TiO_2$, ZnO, or other metal oxides or their mixtures.

Analysis conducted by the inventors herein shows that the prior-art composition, disclosed, e.g., in aforementioned reference to E. C. Hagberget, et al, comprises at least pentaerythritol tetrakis-(2-mercaptopropionate) (PTMP) as a thiol, and an -ene component selected from the group containing (T1) 1,4-cyclohexanedimethanol divinyl ether (E1); (T2) 2-ethyl-2-(hydroxymethyl)-1,3-propanediol triacrylate (E2); (T3) 2,4,6-triallyloxy-1,3,5-triazine (E3); (T4) [50%] (E1)+[50%] bisphenol (E4), where E4 is ethoxylated(2) bisphenol A dimethacrylate; (T5) [50%] (E2)+[50%] bisphenol (E4) 425; (T6) [50%] (E3)+[50%] bisphenol (E4) 1800. An additional component is a photoinitiator, the name of which was not mentioned in the prior-art source. However, as mentioned above, such a composition is intended for developing an imprint in the presence of $O_2$. The composition is not doped with an inorganic precursor, does not contain a stabilizer, and cannot provide a high refractive index, e.g., 1.6 or higher.

In contrast to this, the authors of the present invention use thiol compounds selected from the following group: ethanedithiol, biphenyl-4,4'-dithiol, 1,4-Bis(4-mercaptophenyl)benzene, 1,3,4-thiadiazole-2,5-dithiol, (1,2,4) thiadizole-3,5-dithiol, poly(ethylene glycol) dithiol, 1,3,5-Trimercaptobenzene, 4-mercaptomethy-1,8-dimercapt-3,6-dithiaoctane, 5,7-Dimercaptomethyl-1,11-dimercapto-3,6-trithiaundecane, bis(mercaptoethyl)sulfide, 2,5-Bis (mercaptomethyl)-1,4-dithiane, tetra(ethylene glycol) dithiol, 2,2'-(Ethylenedioxy)diethanethiol, 1,1',4',1''-Terphenyl-4-thiol, 2-Thiazoline-2-thiol, 5-Bromopyridine-2-thiol, and, as an indispensible component of thiols, one selected from the group consisting of benzene-1,3-dithiol, benzene-1,4-dithiol, 1,2-pentanedithiol, and pentaerythritol tetrakis (3-mercaptopropionate), and biphenyl-4-thiol.

-Ene monomers of the composition proposed by the inventors comprise compounds selected from the following group: ethoxylate diacrylate, bisphenol A dimethacrylate, ethylene glycol diacrylate, ethylene glycol diacrylate, pentaerythritol tetraacrylate, trimethylolpropane ethoxylate triacrylate, glycerol propoxylate (1PO/OH) triacrylate and as indispensible components -ene monomers selected from tetravinyl silane, tetravinyl tin, bisphenol A and bisphenol A ethoxylate dimethacrylate, tetravinyl silane, tetravinyl tin, etc.

The combination of a thiol and an -ene monomer is chosen to have a refractive index between 1.6 and 1.8.

The composition of the invention also includes a polymerization initiator, e.g., a photo or thermal initiator such as 2-hydroxy-2-methylpropiophenone, but other photoinitiators can also be used. The typical amount of photoinitiator used varies from 0.1 to 5% in total solids.

The authors have unexpectedly found that according to another aspect of the invention, the use of a polymer matrix with a thiol having a low molecular weight but a high refractive-index in combination with multifunctional molecules of -ene (E) monomers mixed with a photoinitiator and, optionally, with an inorganic precursor ($TiO_2$, ZnO, etc) imparts to the patterned structures improved transparency (T>90%) and a high refractive index (n>1.65) unattainable by any known prior art composition without a postannealing step.

Addition of an inorganic sol-gel precursor or inorganic components can be used for adjusting the refractive index and/or transmittance of the NIL ink. The inorganic components may comprise an oxide of a metal selected from Groups 2B and 4B of the periodic table. The metal oxide, preferably $TiO_2$, is used in an amount of 0.1 to 80 wt. % per weight of the composition, preferably, 10 to 40%.

The effect of the content of $TiO_2$ in the composition of the invention is shown in FIG. 1, where the refractive index (n) is plotted on the ordinate axis, and the wavelength (nm) is plotted on the abscissa axis. Measurements were carried out by ellipsometry on cross-linked thiol-ene films doped with a TiO2 content ranging from 0 to 80 wt. %. Annealing was performed at a temperature up to 250° C. for 10 min.

In fact, the composition had a refractive index in the range of 1.6 to 1.95 and a transmission higher than 80 to 99% per 1-micron thickness.

Figure 2:
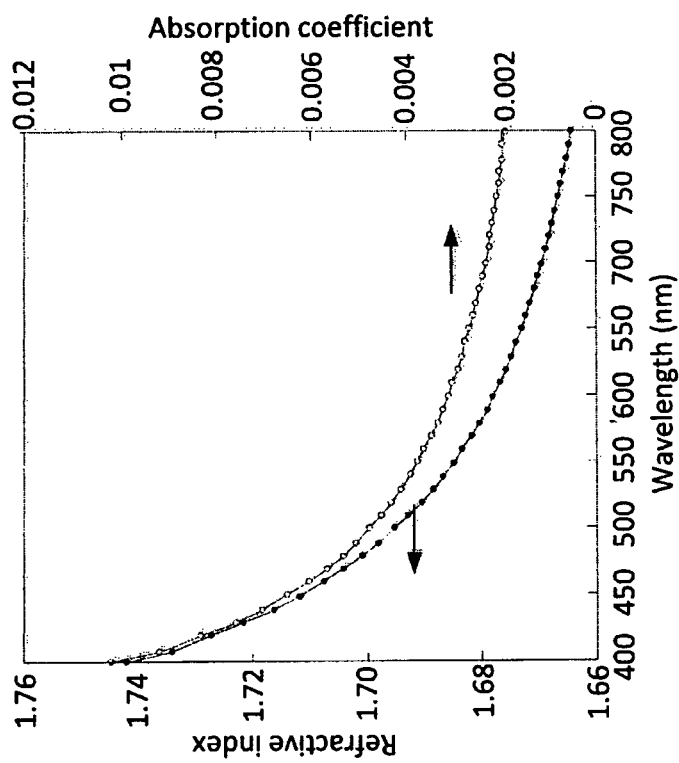
FIG. 2 illustrates the effect of the wavelength on the refractive index and the adsorption coefficient.

FIG. 2 illustrates the optical properties of the films obtained with the use of the composition of the invention. The graph shows the effect of the wavelength on both the refractive index and the adsorption coefficient. The films could be obtained without cracks at maximum thickness up to 10 μm. Deposition was carried out by droplet dispensing. No annealing was needed. Thiol-enes were produced from the reaction between a thiol compound and a monomer containing a reactive double bond (the -ene monomer). The -ene monomers may include vinyls, acrylates, methacrylates, vinyl-ethers, and allyls.

A solution, if used, comprises thiol and -ene monomers (as listed above) with a ratio from 1:10 to 10:1 optionally mixed with a sol-gel precursor or inorganic nanoparticles. The function of the sol-gel precursor or inorganic nanoparticles is to adjust the refractive index and transmittance of the composite. The percentage of the sol-gel precursor or inorganic nanoparticles varies from 0% to 80%.

The function of the polymerization initiator used in the composition is to catalyze the crosslinking process. Crosslinking is produced, e.g., through a free-radical process. A common initiator is 2-hydroxy-2-methylpropiophenone, but other initiators can also be used. The typical amount of polymerization initiator used varies from 0.05 to 10% in total solids.

The curing process is performed through radiation energy, e.g., ultraviolet light or thermal annealing. Curing is carried out at UV radiation power in the range of 12 $mW/cm_2$ to 23 $mW/cm_2$, with curing time in the range of 30 sec to 2 min, the curing being carried out at room temperature. A typical dose of UV light radiation is 17 $mW/cm_2$ during 2 min. The wavelength ranges from 200 nm to 450 nm. The applied pressure varies from 1 bar to 10 bar in air, or in a controlled atmosphere like N2, Ar, etc. For thermal curing, the typical conditions are selected in the range of 5 min at 180° C. to 10 min at 100° C., but depending on specific conditions of the mold, substrate, and ink composition, the thermal crosslinking conditions may vary in a broad range of time-temperature combinations.

Stabilizers are added to increase the shelf life of the material. A common radical stabilizer is 4-methoxyphenol, pyrogallol, or 4-tert-butyl-1,2-dyhydroxy benzene. A typical concentration of a radical stabilizer ranges from 1 mM to 1M. Acidic compounds are used as costabilizers, including benzoic acid, benzenesulfonic acid, phenylphosphonic acid, and vinylphosphonic acid. The typical concentration of the costabilizer ranges from 1 mM to 1M. Material can also be kept below 0° C. in order to stop the reaction and to increase the shelf life. The obtained thiol-ene resist can be used in its pure form or in a solution with a compatible solvent. A typical solvent is polyglycol methyl ether acetate (PGMEA), but other solvents can also be used, including toluene.

The material can be patterned through the direct- or reverse-imprint process. The patterning should be carried out by molding or by a roll-to-roll process. A hard or flexible mold is employed for the process. The mold can be made of ceramic, metal, or polymers including quartz, silicon, silicon nitride ($Si_3N_4$), diamond-like carbon, nickel, polydimethyl siloxane (PDMS), ethylene tetrafluoroethylene (ETFE), OrmoStamp® (from MicroResist Technology), polyethylene terephthalate (PET), etc. The mold is treated with an antisticking layer such as 1H,1H,2H,2H-perfluorooctyl trichlorosilane (or others) to facilitate mold release.

A hard or flexible substrate is used for the process. The substrate can be made of ceramic, metal, or polymer, including polyethylene terephthalate, silicon, Si3N4, nickel, steel, and quartz. The deposition can be performed by spin coating, drop cast, wire bar, or spray coating. It is sometimes necessary to pretreat the surface of the substrates. So far only the following two conditions were tested but other conditions can be tested as well if necessary:

silicon wafer was treated by vapor deposition with 3-(trimethoxysilyl)propyl methacrylate at 130° C. for 30 min; substrate was treated with oxygen plasma for 1 min; then, a thin layer of $CP_4$ was coated on the substrate and annealed at 100° C. for 2 min. Then, another layer of $CP_4$ was coated on the substrate. These conditions can vary, depending on the nature of the substrate, etc.

To obtain homogenous films by spin coating, it is recommended to pretreat the surface before application of the coating, e.g., by plasma activation or deposition of an adhesive layer of (3-mercaptopropyl) trimethoxysilane.

Although the invention is described in detail with reference to specific compounds and processes, these compounds and processes are given only as examples, and any changes and modifications are possible without deviation from the scope of the attached patent claims. For example, various reaction initiators, solvents, stabilizers, or other additives can be used provided they are not detrimental to the object of the invention.

The invention claimed is:

1. A nanoimprint lithography (NIL) ink comprising:
   a thiol;
   an ene monomer; and
   a polymerization initiator,
   wherein the NIL ink has a refractive index between 1.6 and 1.95 and a transmittance per micron thickness between 80% and 99%.

2. The NIL ink of claim 1, wherein the thiol comprises at least one of ethanedithiol; biphenyl-4,4'-dithiol; 1,4-Bis(4-mercaptophenyl)benzene; 1,3,4-thiadiazole-2,5-dithiol; (1,2,4) thiadizole-3,5-dithiol; poly(ethylene glycol) dithiol; 1,3,5-trimercaptobenzene; 4-mercaptomethy-1,8-dimercapt-3,6-dithiaoctane; 5,7-dimercaptomethyl-1,11-dimercapto-3,6-trithiaundecane; bis(mercaptoethyl)sulfide; 2,5-bis(mercaptomethyl)-1,4-dithiane, tetra(ethylene glycol) dithiol; 2,2'-(ethylenedioxy)diethanethiol; 1,1',4',1''-terphenyl-4-thiol, 2-thiazoline-2-thiol; 5-bromopyridine-2-thiol; benzene-1,3-dithiol; benzene-1,4-dithiol; 1,2-pentanedithiol; pentaerythritol tetrakis(3-mercaptopropionate) or biphenyl-4-thiol.

3. The NIL ink of claim 1, wherein the ene monomer comprises at least one of: ethoxylate diacrylate; bisphenol A dimethacrylate; ethylene glycol diacrylate; ethylene glycol diacrylate; pentaerythritol tetraacrylate; trimethylolpropane ethoxylate triacrylate; glycerol propoxylate (1P0/0H) triacrylate; tetravinyl silane; tetravinyl tin; bisphenol A; or bisphenol A ethoxylate dimethacrylate.

4. The NIL ink of claim 1, wherein the polymerization initiator comprises at least one of a photo initiator or a thermal initiator in an amount between 0.1% and 5% in total solids.

5. The NIL ink of claim 1, further comprising an oxide of a metal from Groups 2B or 4B of the periodic table in an amount between 0.1 and 50 weight/weight %.

6. The NIL ink of claim 1, further comprising titanium dioxide in an amount between 10 and 40 weight/weight %.

7. The NIL ink of claim 1, further comprising a stabilizer.

8. The NIL ink of claim 1, wherein the thiol and ene monomer are present in a stoichiometric ratio.

9. The NIL ink of claim 1, further comprising a solvent.

10. A method of manufacturing an optical structure, the method comprising:
    obtaining a nanoimprint lithography (NIL) ink comprising a thiol, an ene monomer, and a polymerization initiator, wherein the NIL ink has a refractive index between 1.6 and 1.95 and a transmittance per micron thickness between 80% and 99%; and
    patterning the NIL ink to form an optical structure.

11. The method of claim 10, wherein patterning the NIL ink comprises:
    depositing the NIL ink on a substrate;
    imprinting the deposited NIL ink with a mask; and
    curing the imprinted NIL ink.

12. The method of claim 11, wherein the optical structure has a refractive index between 1.6 and 1.95 and a transmission per micron thickness between 80% and 99%.

13. The method of claim 11, wherein patterning the NIL ink to form the optical structure further comprises annealing the cured NIL ink.

14. The method of claim 11, wherein depositing the NIL ink on the substrate comprises droplet dispensing the NIL on the substrate.

15. The method of claim 11, wherein depositing the NIL ink on the substrate comprises spin coating, spray coating, or drop casting the NIL ink on the substrate.

16. The method of claim 11, wherein curing the imprinted NIL ink comprises applying UV radiation to the imprinted NIL ink.

17. The method of claim 11, wherein curing the imprinted NIL ink comprises applying thermal radiation to the imprinted ink.

18. The method of claim 10, wherein the NIL ink further comprises at least oxide of a metal from Groups 2B or 4B of the periodic table in an amount between 0.1 and 50 weight/weight %.

19. The method of claim 10, wherein the NIL ink further comprises titanium dioxide in an amount less than 40 weight/weight %.

20. The method of claim 10, wherein the optical structure is formed without annealing.

* * * * *